United States Patent [19]

Speraw

[11] Patent Number: 4,672,509
[45] Date of Patent: Jun. 9, 1987

[54] AIR COOLING ASSEMBLY IN AN ELECTRONIC SYSTEM ENCLOSURE

[75] Inventor: Floyd G. Speraw, Lexington, S.C.

[73] Assignee: NCR Corporation, Dayton, Ohio

[21] Appl. No.: 894,189

[22] Filed: Aug. 7, 1986

[51] Int. Cl.[4] .............................................. H05K 7/20
[52] U.S. Cl. ................................... 361/384; 361/391; 361/415; 211/41; 174/16 R; 165/122
[58] Field of Search .............. 361/382, 3, 4, 391–396, 361/415; 211/41; 174/16 R; 62/411, 412, 418; 165/122, 80

[56] References Cited

U.S. PATENT DOCUMENTS

| | | | |
|---|---|---|---|
| 4,006,388 | 2/1977 | Bartholomew | 174/16 R |
| 4,158,875 | 6/1979 | Tajima | 361/384 |
| 4,233,644 | 11/1980 | Hwang | 361/384 |
| 4,277,815 | 7/1981 | Skroupa | 361/383 |
| 4,293,891 | 10/1981 | Matsui | 361/383 |
| 4,399,485 | 8/1983 | Wright | 361/383 |
| 4,489,363 | 12/1984 | Goldberg | 361/383 |
| 4,530,033 | 7/1985 | Meggs | 361/415 |
| 4,533,977 | 8/1985 | Koppensteiner | 361/415 |

FOREIGN PATENT DOCUMENTS

| | | | |
|---|---|---|---|
| 3038719 | 10/1981 | Fed. Rep. of Germany | 361/383 |
| 2,062,970 | 5/1981 | United Kingdom | 361/383 |

OTHER PUBLICATIONS

Ventilation System for Data Processing Systems, Hammer, IBM Tech. Discl. Bull., vol. 17, No. 9, Feb. 75, p. 2529.

Primary Examiner—G. P. Tolin
Attorney, Agent, or Firm—Wilbert Hawk, Jr.; Edward Dugas; Floyd A. Gonzalez

[57] ABSTRACT

An air cooling assembly in an electronic system enclosure having an upper wire rack and a lower wire rack. A plurality of logic module cassettes are located between the upper and lower wire racks and are provided with openings so that cooling air drawn through parallel rods in the wire racks pass through the logic module cassettes. An intake plenum is located under the lower wire rack, and an exhaust plenum is located over the upper wire rack. A fan is located in the exhaust plenum for drawing cooling air through the logic module cassettes.

9 Claims, 11 Drawing Figures

FIG. 9
FIG. 10
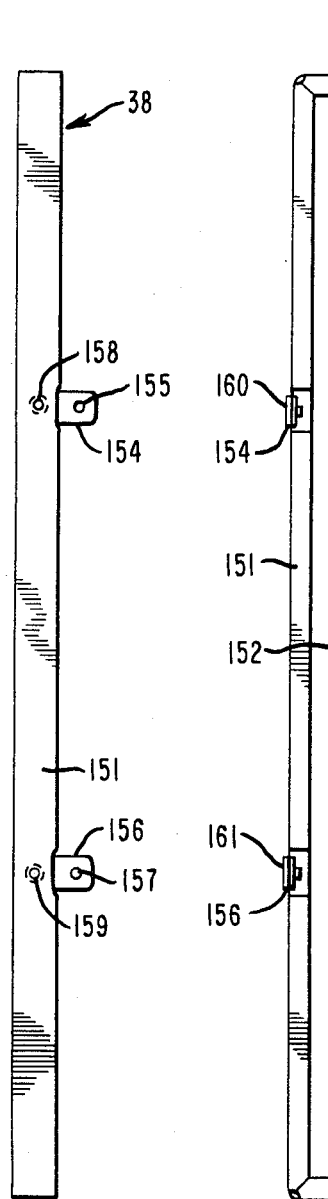
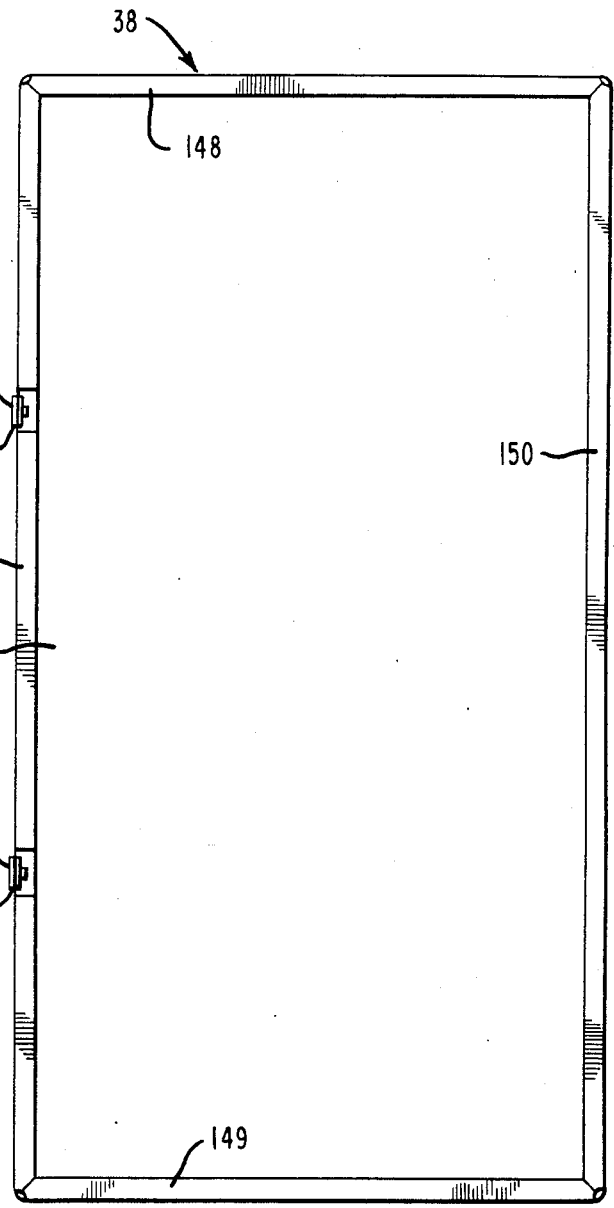

AIR COOLING ASSEMBLY IN AN ELECTRONIC SYSTEM ENCLOSURE

BACKGROUND OF THE INVENTION

The present invention is related to an electronic system enclosure such as a computer cabinet, and more particularly to an assembly for air cooling and electronic system enclosure.

An important consideration in the design of an enclosure for an electronic system, such as a computer cabinet, is provision for cooling the electronic components within the system. This is particularly important in modern computer systems having closely spaced printed circuit boards having a high density of integrated circuits and other electronic components which need to be cooled for proper operation.

U.S. Pat. No. 4,006,388 to Bartholomew, issued Feb. 1, 1977 for "Thermally Controlled Electronic System Package" discloses a system having a plurality of plug in modules wherein air or other coolant is furnished to a central plenum, and metered to cooling fans on the modules.

U.S. Pat. No. 4,158,875 to Tajima et al. issued Jun. 19, 1979 for "Air Cooling Equipment For Electronic Systems" discloses air cooling equipment for use in electronic systems wherein the air cooling equipment uses a double-walled duct construction and air coolant is introduced in a direction at high angles to the length of the heat-generating electronic package.

U.S. Pat. No. 4,233,644 to Hwang et al. issued Nov. 11, 1980 for "Dual-Pull Air Cooling For A Computer Frame" discloses an air cooling arrangement for a column of integrated circuit modules wherein one air moving device is located at the top and one air moving device is located at the bottom of the column, each pulling air through the column. This arrangement confines the air flow to a vertical impinging pattern.

U.S. Pat. No. 4,293,891 to Matsui et al. issued Oct. 6, 1981 for "Natural Air Cooled Rack For Vertically Disposed Printed Boards" discloses vertically disposed air cooled racks for printed circuit boards having stacked cases. Draft openings and exhaust openings are provided between the stacked racks such that the draft opening for an upper rack is above the exhaust opening of a lower rack.

U.S. Pat. No. 4,399,485 to Wright et al. issued Aug. 16, 1983 for "Air Baffle Assembly For Electronic Circuit Mounting Frame" discloses a variable width baffle assembly for monitoring uniform impedance to the flow of cooling air moving vertically through a partially populated electronic mounting frame for printed circuit board assemblies.

U.S. Pat. No. 4,489,363 to Goldberg issued Dec. 18, 1984 for "Apparatus For Cooling Integrated Circuit Chips" discloses an arrangement having a plurality of spaced apart walls with the elements to be cooled mounted on heat sinks mounted in openings in the walls. Air is introduced on one side of the walls and exhausted to the other side such that cooling air flows through the heat sinks, cooling the elements mounted thereon.

U.S. Pat. No. 4,530,033 to Meggs issued Jul. 16, 1985 for "Card Frame For Circuit Cards" discloses a circuit card frame wherein the circuit cards are held vertically in groves in a top and a bottom panel. The top and bottom panels are perforated to provide ventilation requirements.

U.S. Pat. No. 4,533,977 to Koppensteiner et al. issued Aug. 6, 1985 for "Printed Wiring Board Assembly Employing Track Engaging Runners" discloses a printed wiring board assembly having top and bottom track arrays. Each printed wiring board has glide runners on its top and bottom edges to run on one of the upper and lower tracks, respectively.

SUMMARY OF THE INVENTION

In a specific embodiment of the invention, an air cooling apparatus is disclosed including a cabinet having an upper wire rack and a lower wire rack, each of the upper and lower wire racks having spaced apart, parallel rods, and a plurality of logic module cassettes, each logic module cassette having a vertical member sized to slideably fit between the upper and lower wire racks. An upper glide member is included on the vertical member having guide means engageable with two of the parallel rods of the upper wire rack. A lower glide member is also included on the vertical member having guide means engageable with two of the parallel rods of the lower wire rack so that each of the logic module cassette slides between corresponding parallel rods of the upper and lower wire rack. The upper and lower glide members have openings therethrough for allowing cooling air to move through the openings of the upper and lower guide members such that cooling air may move through each of the logic module cassettes. A fan is provided in the upper portion of the cabinet above the upper wire rack for drawing cooling air upwardly through the logic module cassette.

One of the objects of the present invention is to provide an air cooling assembly for an electronic system in which the cooling air moves in the same direction as the natural convection of the heat given off by the elements to be cooled.

Another object is to provide slideable modules having air channels therethrough, which modules have glides that slide between parallel rods of wire racks, and in which cooling air flows between the parallel rods, through openings in the glides, and through the air channels for cooling electronic elements therein.

It is another object to provide an air cooling assembly for an electronic system wherein cooler ambient air is taken from near the floor, and drawn through air channels in the assembly for cooling electronic elements therein.

It is another object to provide an air cooling assembly having a module receiving space, a plurality of modules therein having air channels therethrough in which are located electronic elements to be cooled, and a plurality of fillers in the module receiving space not occupied by a module for blocking air flow such that cooling air will be diverted to the air channels through the modules containing electronic elements to be cooled.

It is a further object to provide an air cooling assembly for cooling electronic elements having cassette modules continuing printed circuit boards in air channels through which is drawn cooling air.

It is a further object to provide an air cooling assembly for cooling electronic elements in which fans for drawing cooling air over the electronic elements to be cooled are located such that any heat added to the cooling air by the fans is added after the air has been drawn over the electronic elements to be cooled.

These and other objects of the present invention will become apparent from the description of the preferred embodiment and the drawings herein.

BRIEF DESCRIPTION OF THE DRAWINGS

FIG. 9 is an end elevation of a filler module of FIG. 8;

FIG. 10 is a side elevation of the filler module of FIG. 9; and

DESCRIPTION OF THE PREFERRED EMBODIMENT

Figure 1:
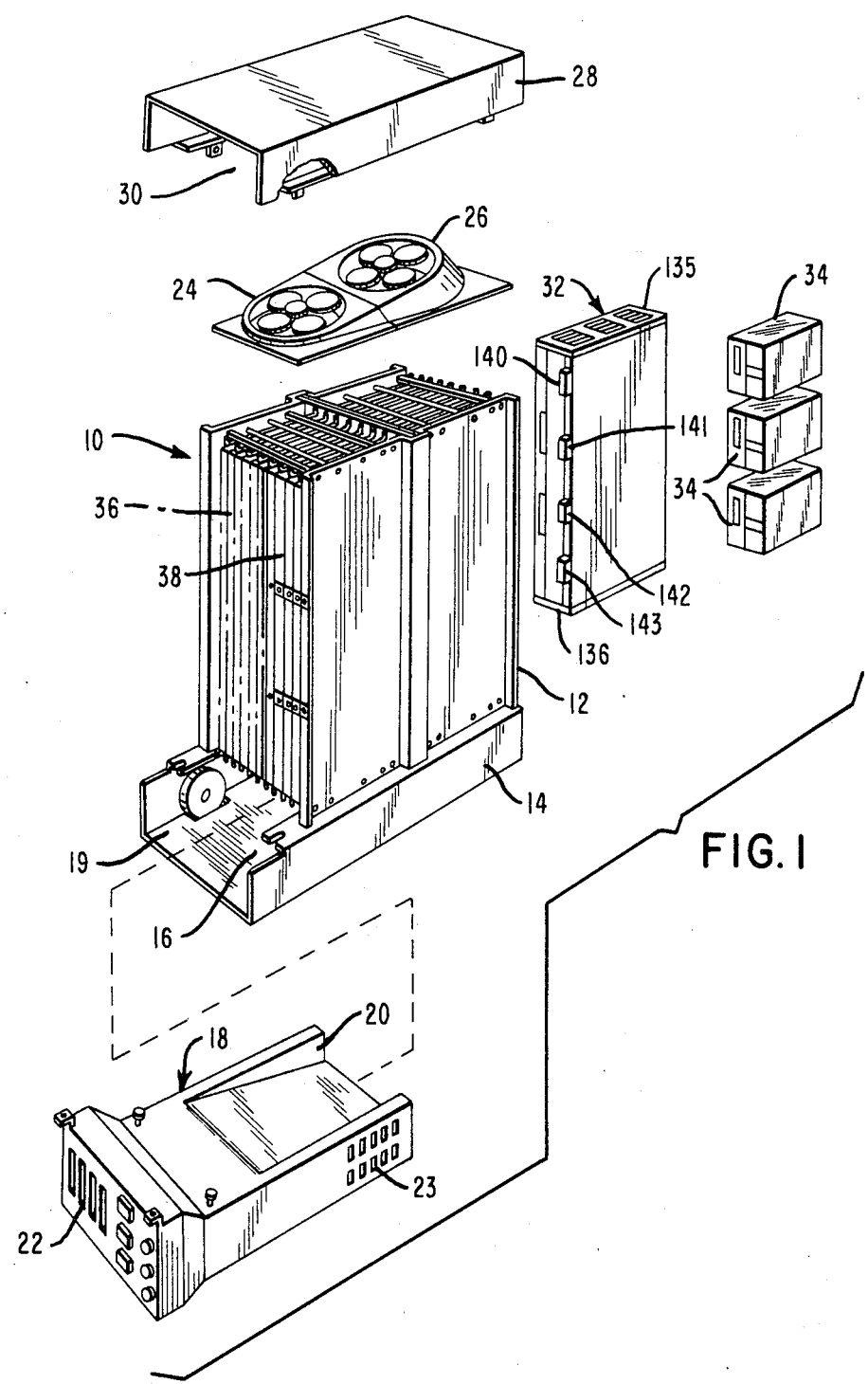
FIG. 1 is an exploded view of a computer cabinet including the cooling system of the present invention.

FIG. 1 is an illustration of an exploded view of a computer cabinet including the cooling system of the present invention. The computer cabinet includes a rear cabinet portion 10 and a front cabinet portion 12. The cabinet portions 10 and 12 are mounted on a roller-mounted bottom support member 14. The bottom support member 14 is in the form of an open channel for forming an input plenum 16. A containerized module 18, in this case a bulk DC supply module, is slideably located in the rear portion 19 of the input plenum 16 of the bottom support member 14. The containerized module 18 includes a cut-out portion 20 which forms an air scoop in the plenum 16 for supplying cooling air to the cabinet portions 10 and 12, to be explained. The containerized module 18 includes its own cooling vents 22 through which cooling air is drawn from the outside. The cooling air which flows through the module 18 is then exhausted through a set of side vents 23 into the input plenum 16.

On top of the cabinet portions 10 and 12 are exhaust fans 24 and 26, exhaust fan 24 for the rear cabinet portion 10 and exhaus fan 26 for the front cabinet portion 12. A top member 28 is positioned on top of the cabinet portions 10 and 12 over the exhaust fans 24 and 26, and is in the form of an open channel for forming an exhaust plenum 30.

The front cabinet portion 12 may contain one or more containerized modules 32, in this a case DC supply module, and one or more computer peripheral modules 34, in this case peripheral devices containing fixed drives, tape drives, or flexible disk drives. A plurality of cassette modules 36, and a plurality of module fillers 38 are located in the rear cabinet portion 10.

Figure 2:
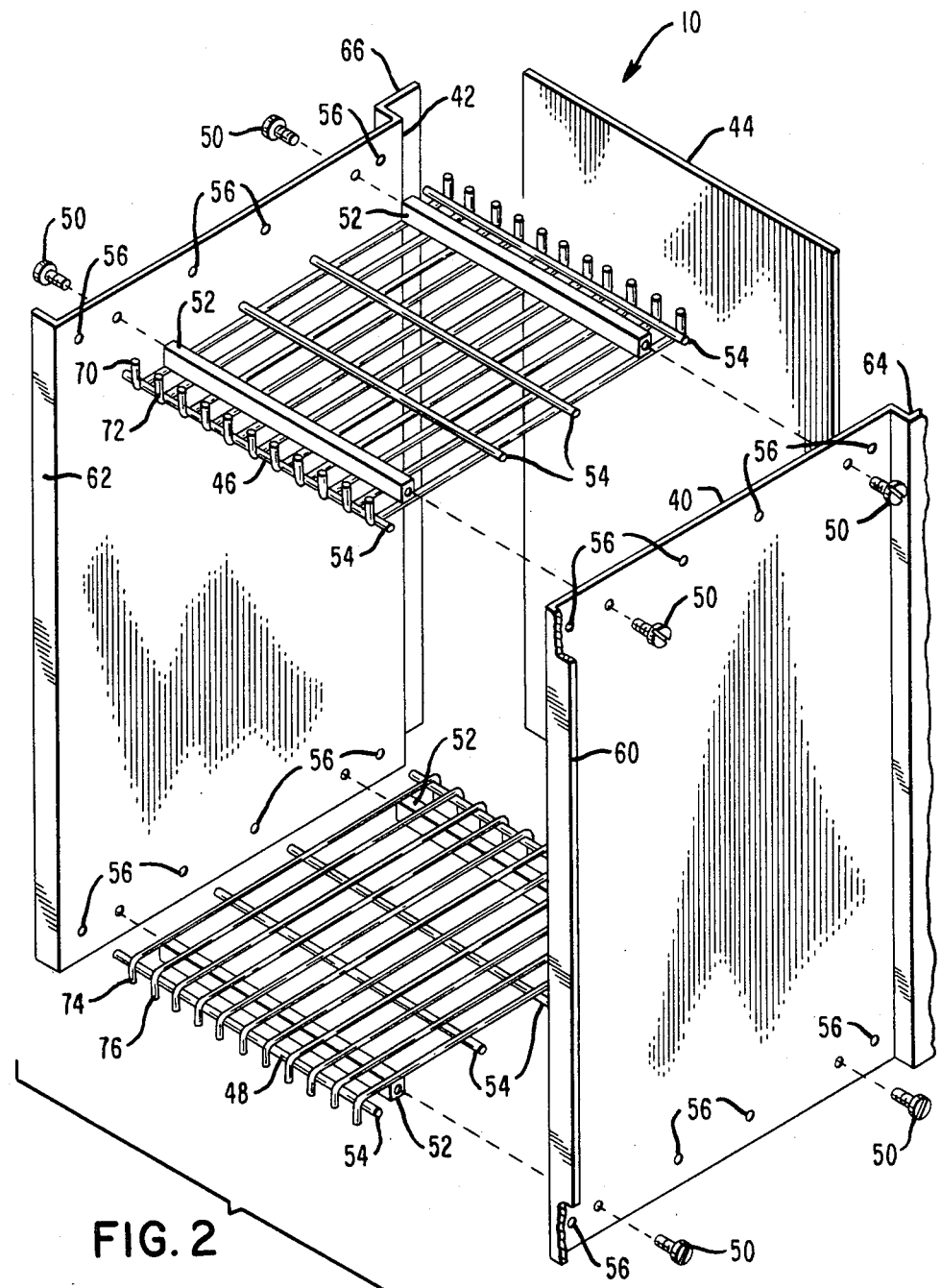
FIG. 2 is an exploded view of a rear cabinet portion of the computer cabinet of FIG. 1.

FIG. 2 presents an exploded view of the rear cabinet portion 10 of FIG. 1. The rear cabinet portion 10 includes a right side 40 (when viewed from the rear of the computer cabinet of FIG. 1), a left side 42 and a back plane member 44. Trapped between the right side 40 and the left side 42 is an upper rack member 46 and a lower rack member 48. The rack members 46 and 48 are fastened into position between the right side 40 and the left side 42 by appropriate fastening means such as screws 50 which pass through the right side 40 and left side 42 into lateral support members 52 of the upper and lower racks 46 and 48. In addition to the screws 50, the upper and lower racks 46 are provided with lateral rod supports 54 whose ends fit into holes 56 provided in the right side and left side members 40 and 42 respectively. The rear-most ends of the side members 40 and 42 include a single bend for providing a flange 60 on the right side member 40 and a flange 62 on the left side member 42 for stiffening the side members 40 and 42. The frontmost ends of the side members 40 and 42 include double bends for providing flanges 64 and 66. It will be understood that the front cabinet member 12 is identical to the rear cabinet member 10 shown in FIG. 2 except that the front-most ends of the side members of the front cabinet portion does not include flanges corresponding to the flanges 64 and 66 of the rear cabinet portion 10. It will further be understood that the front cabinet portion 12 is oriented to mirror the orientation of the rear cabinet portion 10 such that the back plane of the front cabinet portion 12 is juxtapositioned with the back plane 44 of the rear cabinet portion 10 in the space between the flanges 64 and 66 (see FIG. 1).

The upper rack member 46 includes a plurality of parallel, spaced-apart bars or rods two of which are shown at 70 and 72. Similarly, lower rack 48 includes a plurality of parallel, spaced-apart bars or rods two of which are shown at 74 and 76 which are in line with and correspond to parallel rods 70 and 72 of upper rack 46. As will be explained later, parallel rods 70 and 72 and corresponding parallel rods 74 and 76 are spaced to accept logic module cassettes 36.

Figure 3:
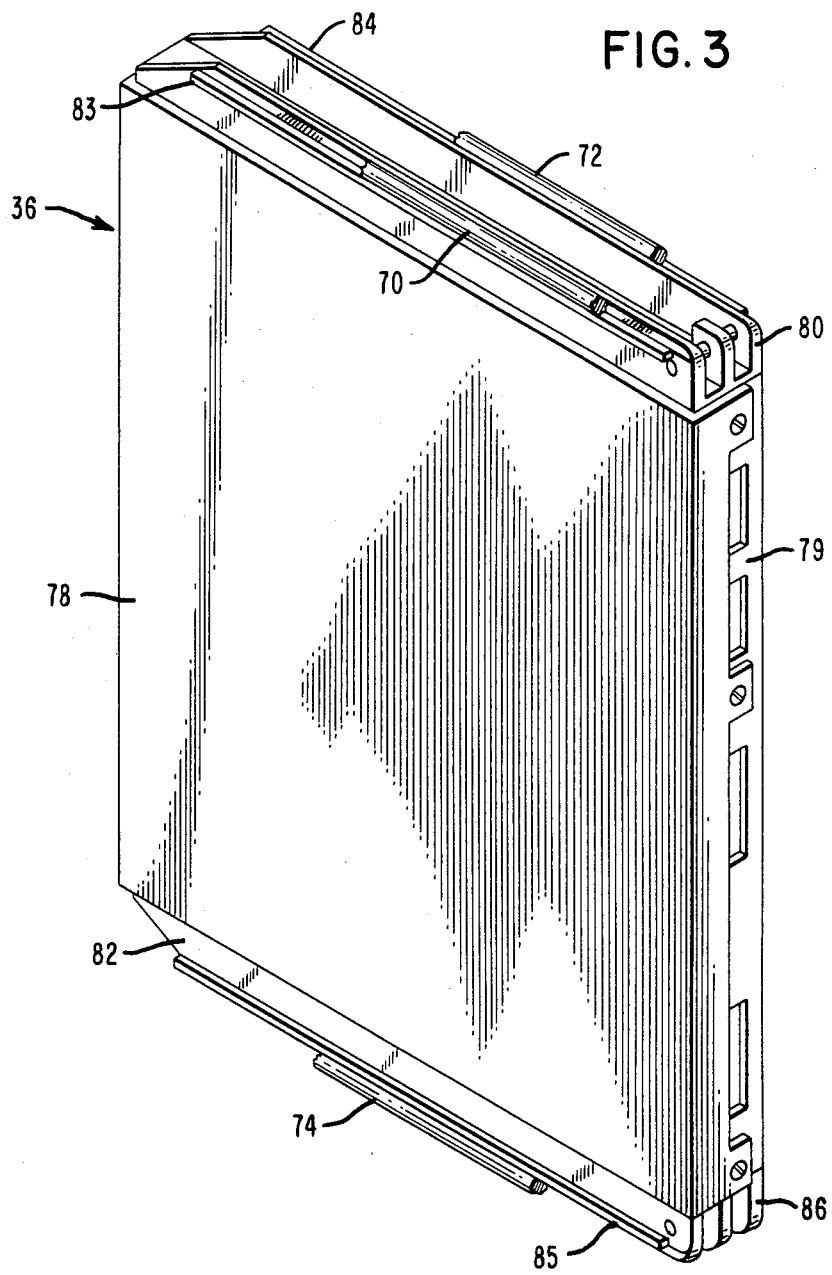
FIG. 3 is a perspective view of a logic cassette module usable with the present invention.

FIG. 3 is a perspective view of one of the logic module cassettes 36 which may be positioned between the parallel rods 70 and 72 in the upper rack 46 of FIG. 1, and the parallel rods 74 and 76 in the lower rack 48. The logic module cassette 36 includes a vertical sidewall 78, a front member 79, an upper glide member 80, and a lower glide member 82. The upper glide member 80 includes guide means 83 and 84 for accepting the parallel rods 70 and 72, respectively. The lower glide member 82 includes guide means 85 and 86 for accepting parallel rod members 74 and 76.

Figure 4:
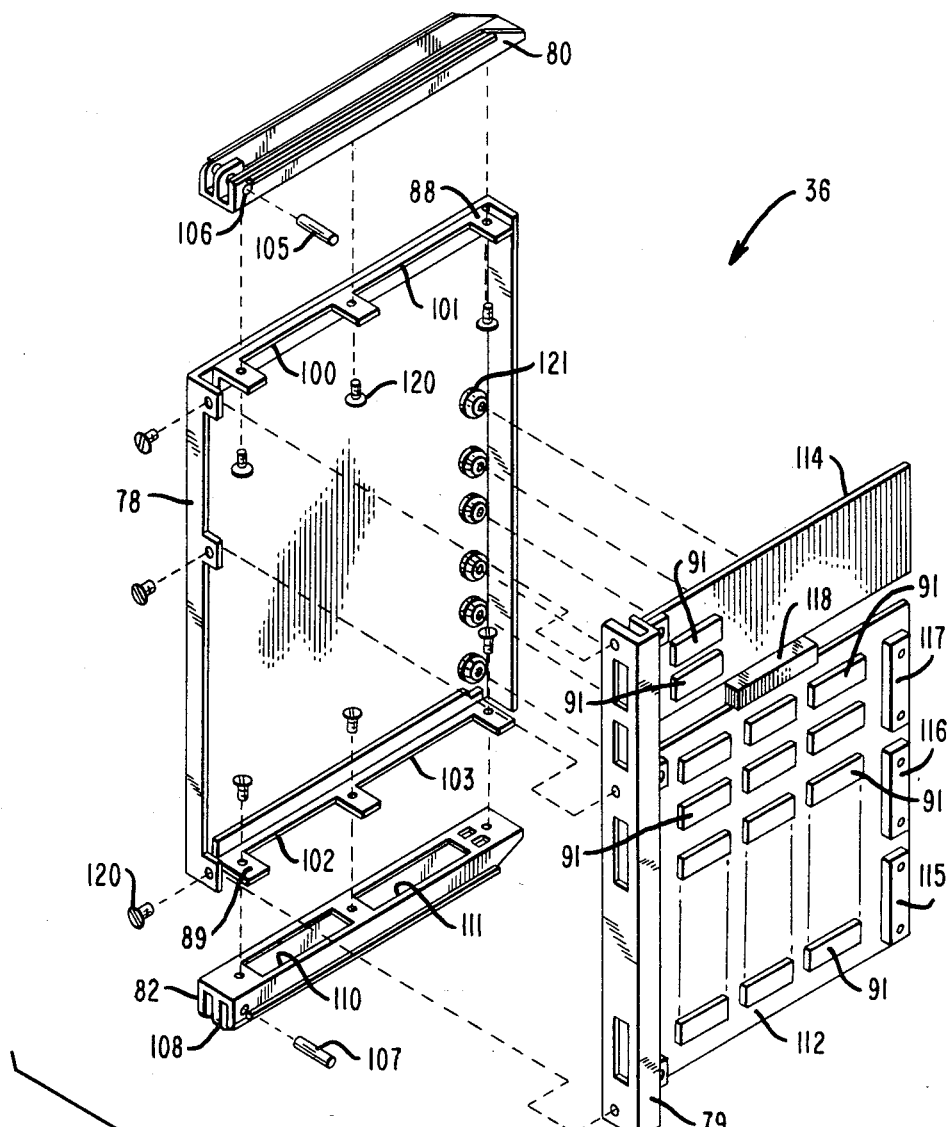
FIG. 4 is an exploded view of the logic cassette module of FIG. 3.

FIG. 4 is an exploded view of the logic module cassette 36 of FIG. 3. Attached to the vertical side member 78 is an upper support member 88 and a lower support member 89. The upper support member 88 has two cut-out portions 100 and 101, and the lower support member includes two cut-out portions 102 and 103 which allow cooling air to move through the cassette 36, to be explained more fully. The upper and lower support members 88 and 89 may be of a strong rigid material such as sheet metal for supplying support to the upper and lower glides 80 and 82. The upper and lower glides 80 and 82 may be formed of self-lubricating material, such as material sold under the trademark TEFLON by E.I. Dupont de Nemours and Co. Glides 80 and 82 provide for an easy slideable movement between the assembled logic module cassette and the parallel, spaced-apart rod members 70 and 72, and 74 and 76. The upper glide member 80 has an ejector pin 105 in appropriate holes 106 in one end thereof, and lower glide 82 has an ejector pin 107 in appropriate holes 108 in one end. The ejector pins 105 and 107 are used in conjunction with ejector handles (not shown) for ejecting the logic module cassettes 36. The ejector handles are fully explained in commonly assigned U.S. Pat. No. 4,628,413, issued Dec. 9, 1986 to Speraw, but do not form a part of this invention and will not be explained further.

The upper and lower glides 80 and 82 contain openings, shown in FIG. 4 at 110 and 111 in lower glide 82. The openings in the glides 80 and 82 register with the cut-out portions 100 and 101 in the upper support member 88 and the cut-out portions 102 and 103 in the lower support member 89 such that cooling air may move through the cassette 36. Attached to the front member 79 of the cassette 36 are printed circuit boards 112 and 114 on which are mounted circuit components to be cooled 91. In the illustration of FIG. 4, printed circuit board 112 represents a processor board, and printed circuit board 114 represents a memory submodule board. The boards 112 and 114 include multi-pin connectors 115, 116 and 117 for providing interconnection between the processor board and corresponding pin connectors (not shown) in the back plane 44 of FIG. 2, and a connector means 118 for providing electrical interconnection between the processor board 112 and the memory submodule 114. It will be understood that various other types of printed circuit boards may be provided in the cassette modules 36. The cassette module 36 is assembled by appropriate fastening means such as the various screws 120 shown in FIG. 4 and the board fastener means 121. The board fastener means may be any means for providing a secure connection between the connectors 115, 116 and 117 of the printed circuit boards 112 and the vertical side member 78. One example of board fastener means 121 which mat be used is shown in the aforementioned U.S. Pat. No. 4,628,413.

Figure 5:
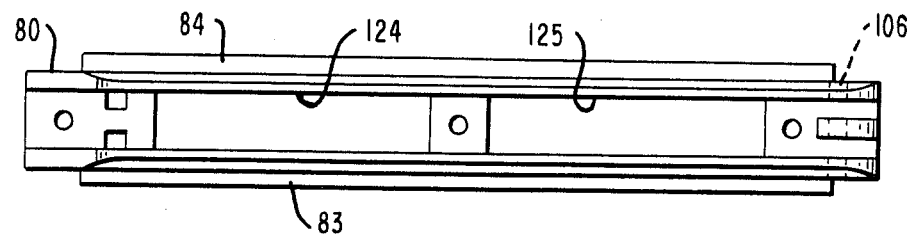
FIG. 5 is a plan view of a top glide of the logic cassette module of FIGS. 3 and 4.

FIG. 5 is a plan view of the upper glide 80 of FIGS. 3 and 4. As previously explained, the upper glide 80 includes guide means 83 and 84 on its sides for receiving the parallel, spaced-apart rods 70 and 72 of the upper rack 46 of FIG. 2. At one end thereof, the upper glide 80 has a hole 106 for receiving the ejector pin 105 of FIG. 4. The upper glide 80 also includes openings 124 and 125 which correspond to the openings 110 and 111 of the lower glide 82 and discussed in connection with FIG. 4. Openings 124 and 125 register with the cut-out portions 100 and 101 of the upper support member 88 of FIG. 4. It can thus be seen that an air channel is provided vertically through the logic module cassette 36 such that cooling air may move through the logic module cassettes over circuit elements to be cooled 91 which are mounted on circuit boards 112 and 114 (see FIG. 4). It will also be understood that each logic module cassette 36 only has one vertical side member 78, with the vertical side member of the next logic module cassette forming its second vertical side.

Figure 6:
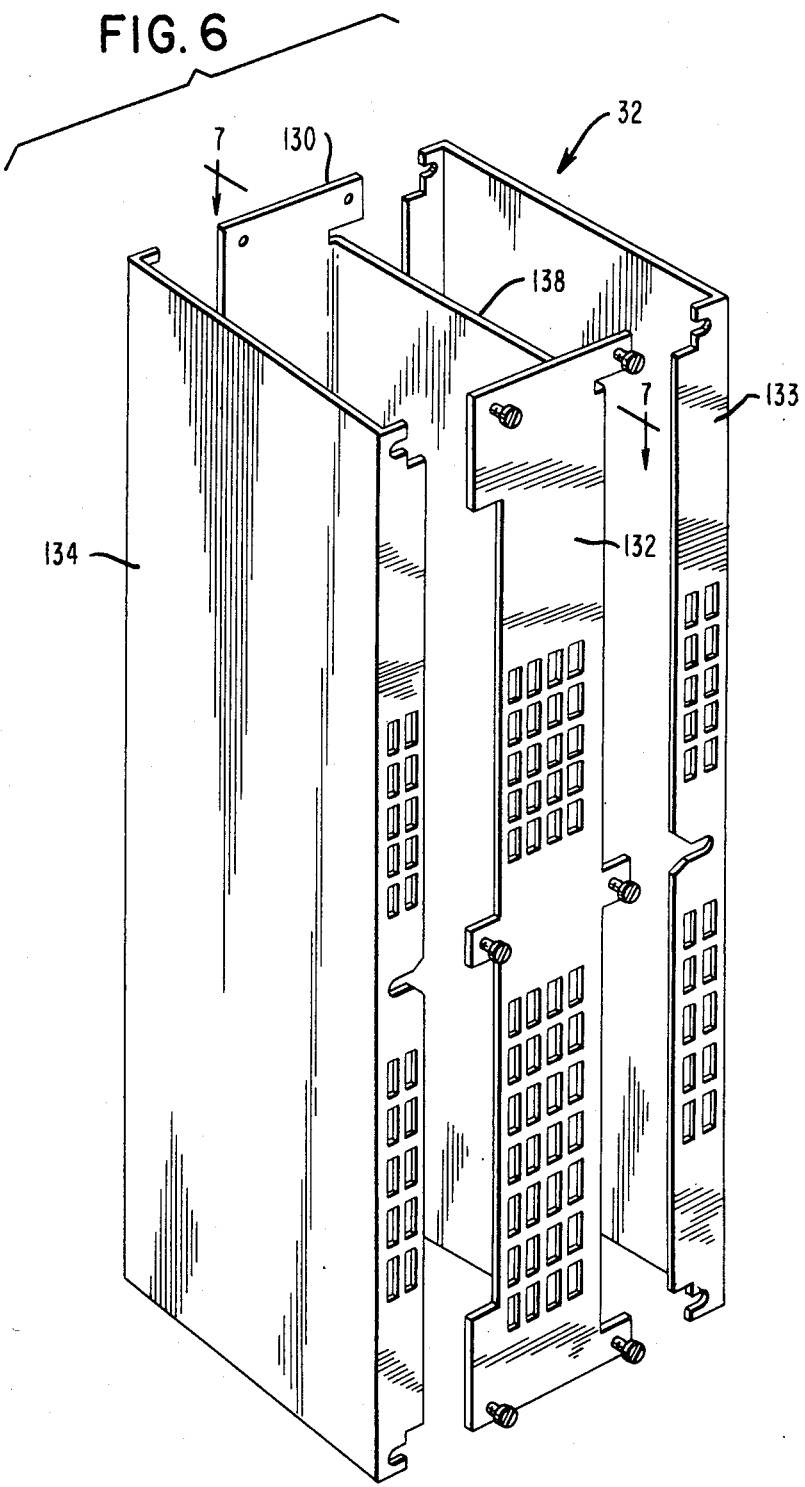
FIG. 6 is an exploded view of a containerized module usable with the present invention.

FIG. 6 is an exploded view of the module 32 of FIG. 1. The module 32 includes a rear panel 130, a front panel 132, a right side cover panel 133, and a left side cover panel 134. The module 32 is of sufficient height and includes a louvered top member 135 and a louvered bottom member 136 (see FIG. 1) such that the completed module 32 may be positioned between the upper and lower wire racks of the front cabinet portion 12 of FIG. 1. Vertically positioned within the module 32 between the rear panel 130 and the front panel 132 is a support wall member 138 upon which may be mounted printed circuit boards 95 and 96 for containing various circuit components to be cooled 93 and 94 (see FIG. 7). As can be seen in FIG. 1, the module 32 includes multiple pin connectors 140, 141, 142 and 143 for providing for electrical connection between the back plane of the front cabinet portion 12 and printed circuit boards 95 and 96 mounted on vertical wall 138 (see FIG. 7).

Figure 7:
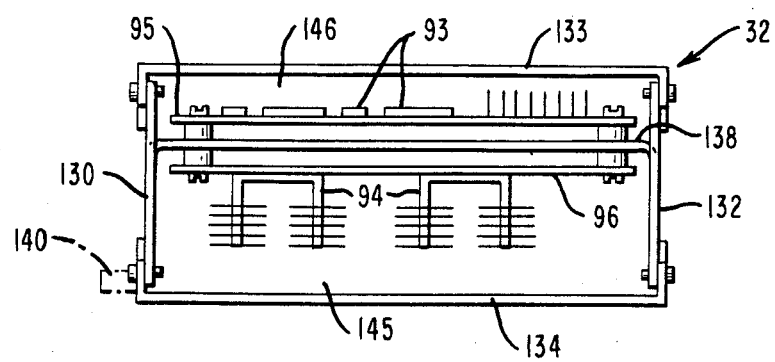
FIG. 7 is a plan view of the containerized module of FIG. 6.

FIG. 7 is a plan view of the assembled module 32 with the louvered top 135 and bottom 136 removed. As can be seen in FIG. 7, the module 32 provides a pair of openings 145 and 146 through which air may move vertically over the components to be cooled 93 and 94 mounted on printed circuit boards 95 and 96, respectively. The printed circuit board 95 includes a control diagnostic logic board which has the intelligence to monitor the intake air temperature in relation to the power used by the computer to determine the desired speed of the fans 24 and 26. The fan voltage is then adjusted as required, to minimize fan noise.

Returning now to FIG. 1, it can be seen that the rear cabinet portion 10 may include a plurality of logic module cassettes 36, and a plurality of module fillers 38. The number of logic module cassettes 36 is determined by the configuration and size of the computer circuits contained within the computer cabinet of FIG. 1. As is known, the computer circuits contained within the cabinet of FIG. 1 may contain (for example) a greater or lesser memory size dependent upon the specifications and requirements of the computer user. It will thus be understood that if the computer within the cabinet of FIG. 1 is very large, it will have a large number of memory modules. In that case, a greater number of the slots provided by the spaces between the parallel rods of the upper and lower wire racks 36 and 38 (see FIG. 2) may be occupied by module cassettes 36 for holding memory printed circuit boards. It will also be understood that multiple cabinets, such as those shown in FIG. 1, may be placed side-by-side to accommodate even more module cassettes 36, if the computer is too large to be held in a single cabinet. However, if the computer contained in the cabinet of FIG. 1 is of a smaller size and requires less than the maximum amount of logic module cassettes 36, the remaining spaces may be filled by module fillers 38.

Figure 8:
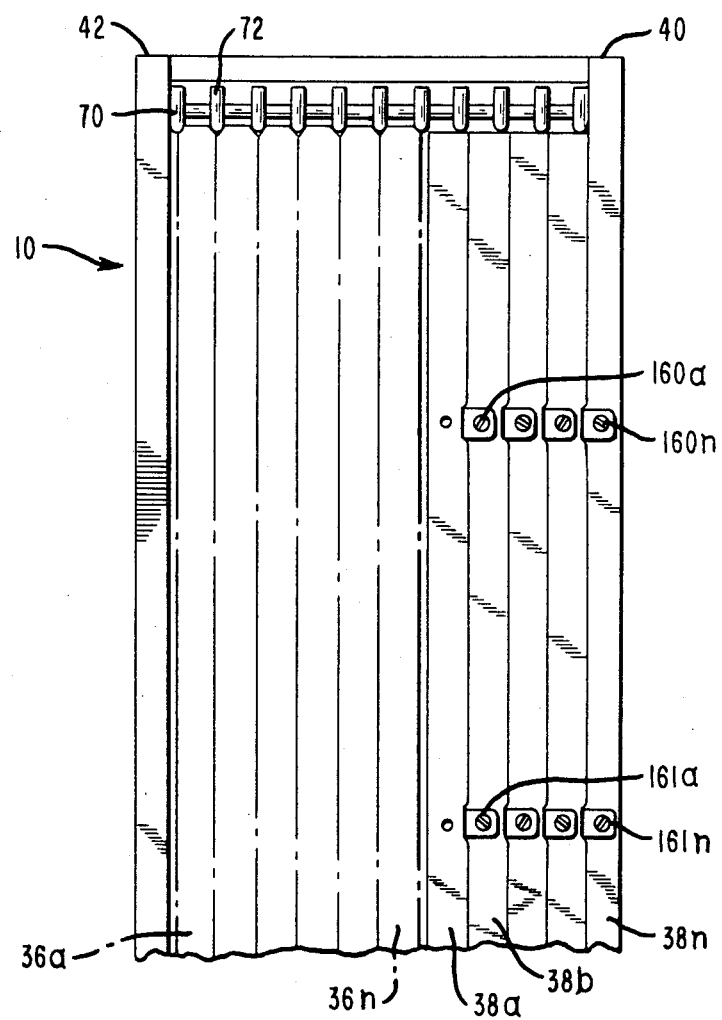
FIG. 8 is a close-up elevation of a portion of a rear cabinet portion of FIG. 2 showing logic cassette modules and filler modules in place.

FIG. 8 is a close-up view of the rear of the cabinet portion 10 in which is located a plurality of logic module cassettes 36a through 36n, and a plurality of a lesser number of module fillers 38a through 38n. FIG. 9 is a frontal view of one of the module fillers 38, and FIG. 10 is a side view of the module filler 38. As shown in FIG. 10, the module filler is an open frame having a top member 148, a bottom member 149, a rear member 150, and a front member 151. The center 152 formed by the members 148 through 151 is left open. As seen in FIG. 9, the front member 151 includes a top tab 154 having a hole 155, and a bottom tab 156 having a hole 157. The front member 151 also includes a top threaded hole 158 and a bottom threaded hole 159. A pair of fasteners such as screws 160 and 161 are provided which pass through the holes 155 and 157 respectively of the tabs 154 and 156 of one module filler and into the threaded holes 158 and 159 respectively of the next module filler. In the case of the rightmost module filler, such as module filler 38n of FIG. 8, the screws 160n and 161n screw into appropriate threaded holes in the right side member 40 of the rear cabinet portion 10.

Since the top 148 and bottom 149 of the logic module fillers 38 are solid, air directed into the bottom of the rear cabinet portion 10 flows around the module fillers 38a-38n and is directed into the air channels through the logic module cassettes 36a-36n to provide cooling to the electrical components 91 within. It will be understood that if a logic module cassette 36n+1 is to be added to the computer in the cabinet of FIG. 8, the screws 160a and 161a of the leftmost module filler 38a are unscrewed from the neighboring module filler 38b, and module filler 38a is removed. An additional logic module cassette 36n+1 may now be placed in the rear cabinet portion 10 in place of the just removed logic module filler 38a.

Figure 11:
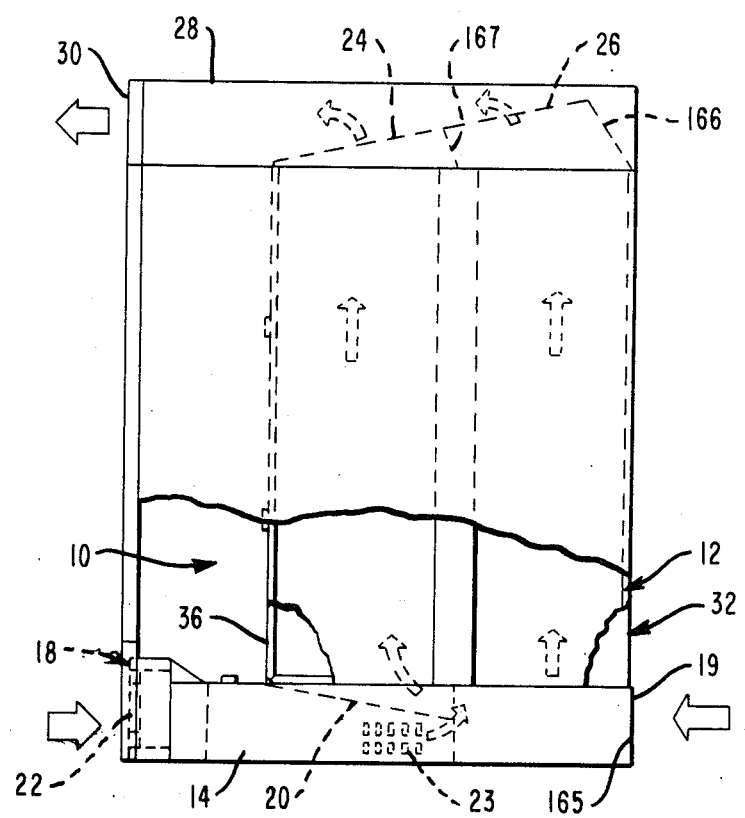
FIG. 11 is a side elevation of a fully assembled computer cabinet of FIG. 1 with a portion broken away, and showing the flow of cooling air therethrough.

FIG. 11 is a side elevational view of a fully assembled cabinet wherein a portion of the side is broken away so as to show the rear cabinet portion 10 and the front cabinet portion 12. The bulk DC supply module 18 has been fully inserted into the input plenum 19 formed by the bottom cabinet member 14. It will be seen that the cut-out portion 20 of the bulk DC supply module 18 provides a path for air from the input plenum 19 at the bottom of the cabinet to the air channels (146 and 147 of FIG. 7) of the module 32 in the front cabinet portion 12, and the air channels of the logic module cassettes 36 in the rear cabinet portion 10. Air flows into the logic modules 36 through openings 110 and 111 (see FIG. 4) and is exhausted through openings 124 and 125 (see FIG. 5). Air is drawn by the fans 24 and 26 from the input plenum 19 through the air channels as described, and is exhausted through the exhaust plenum 30 formed by the top member 28. It will be noted that cooling air is drawn both through the module 18 and the forward portion 165 of the input plenum 19. A shroud 166 around the exhaust fan 26 for the front cabinet portion 12 may be formed to be positioned higher in the exhaust plenum 30 than a shroud 167 around the exhaust fan 24 for the rear cabinet portion 10. In this configuration, cooling air drawn through the front cabinet portion 12 by the fan 26 flows through the upper portion of the exhaust plenum 30, and cooling air drawn through the rear cabinet portion 10 by the fan 24 flows through the lower portion of the exhaust plenum 30. If desired, appropriate filtering means may be provided in the forward portion 165 of the input plenum 19 and over the cooling vents 22 (see FIG. 11) to filter dust and other extraneous material from the air drawn into the input plenum 19.

The cooling system of the computer cabinet shown in FIGS. 1 and 11 provides several advantages. Ambient air, which is generally cooler near the floor, is drawn into the bottom of the described air channels through the module 32 and the logic modules 36, and exhausted at their tops. Also, air drawn through the described vertical air channels from the bottom toward the top is in the normal direction of convection currents set up by heat given off by the electrical components in the modules 32 and 36. Thus, the air drawn through the described air channels is assisted by heat convection making cooling of electronic elements in the channels more efficient. Also, the cross-sectional area of the input plenum 19 and the exhaust plenum 30 is sufficient to provide cooling air simultaneously to all of the modules 32 and 36, thus providing maximum air flow through the described air channels with very little pressure drop through the modules 32 and 36. This provides for the maximum heat exchange from the elements to be cooled in the described air channels to the cooling air flowing therethrough. Further, the exhaust fans 24 and 26 are located at the top of the described air channels through the modules 32 and 36 such that any heat added to the air by the fans 24 and 26 is added after the air has passed through the described air channels over the electronic elements to be cooled therein.

Thus, a system has been described which provides the aforementioned objects. It will be understood by those skilled in the art that the disclosed embodiment is exemplary only, and that various components disclosed herein may be replaced by equivalents without departing from the invention hereof, which equivalents are covered by the appended claims.

What is claimed is:

1. In an electronic systems enclosure, an air cooling apparatus comprising:
a cabinet having an upper wire rack and a lower wire rack, each of said upper and lower wire racks having spaced apart, parallel rods;
a plurality of logic module cassettes, each logic module module cassette having a vertical member slideably fit between said upper and lower wire racks and including an upper glide member on the vertical member having guide means movably engaged with two of the parallel rods of said upper wire rack and a lower glide member on the vertical member having guide means movably engaged with two of the parallel rods of said lower wire rack so that each of said logic module cassettes slides between corresponding parallel rods of said upper and lower wire racks; said upper and lower glide members having opening means therethrough for allowing cooling air to move through the opening means of the upper and lower guide members such that cooling air may move through each of said logic module cassettes;
fan means in the upper portion of said cabinet above said upper wire rack for drawing cooling air upwardly through said logic module cassettes; and
a module filler means having the same dimensions as one of said logic module cassettes,
said module filler means slideably located between said upper and lower wire racks and blocking cooling air flow so that blocked cooling air is diverted by said module filler means to flow through said logic module cassettes.

2. The air cooling apparatus of claim 1 wherein said module filler means comprises:
a top member;
a bottom member; and
two vertical end members; said top and bottom members between adjacent ones of said parallel rods of said top and bottom wire racks, and said vertical end members slideably locating said module filler means vertically between said upper and lower wire racks so that cooling air cannot flow between selected parallel rods blocked by said top and bottom members.

3. The air cooling apparatus of claim 2 wherein said module filler means further comprises securing means securing said module filler means in a vertical position between said upper and lower wire racks.

4. The air cooling apparatus of claim 3 wherein said securing means comprises a pair of tabs extending beyond one of the vertical end members in overlapping engagement with a portion of said cabinet such that said module filler means is selectively secured in a position between said upper and lower wire racks.

5. The air cooling apparatus of claim 1 further comprising:

a top plenum member over said fan means for directing air exhausted by said fan means to one end of said cabinet; and bottom plenum member under said lower wire rack and forming an air intake for cooling air drawn through said logic module cassettes by said fan means.

6. The air cooling apparatus of claim 5 further comprising a containerized module in said bottom plenum member, said containerized module having louvered means for allowing a portion of the cooling air for said logic module cassettes to be drawn through said containerized module by said fan means.

7. The air cooling apparatus of claim 6 further comprising:

a vertical wall in said cabinet dividing said cabinet into first and second cabinet portions, said upper and lower wire racks and said plurality of logic module cassettes being located in one of said cabinet portions;

the other of said cabinet portions having a second upper wire rack, a second lower wire rack, and an electronic circuit module slideably located between said second upper and said second lower wire racks, said electronic circuit module having a vertical air passage therethrough;

said bottom plenum member extending under both of said first and second cabinet portions for supplying cooling air to both first and second cabinet portions;

said top plenum member extending over both of said first and second cabinet portions for exhausting cooling air from both first and second cabinet portions; and said fan means having a first fan for drawing cooling air vertically through said first cabinet portion, and a second fan for independently drawing separate cooling air vertically through said second cabinet portion.

8. The air cooling apparatus of claim 7 wherein said fan means includes:

a first shroud member around said first fan for directing air from said first fan through the lower portion of said exhaust plenum;

a second shroud member around said second fan for directing air from said second fan through the upper portion of said exhaust plenum.

9. The air cooling apparatus of claim 8 further comprising modularized computer peripheral devices in said second portion of said cabinet with said electronic circuit module.

* * * * *